(12) United States Patent
Kwack

(10) Patent No.: US 7,430,147 B2
(45) Date of Patent: Sep. 30, 2008

(54) PRECHARGE APPARATUS

(75) Inventor: Seung-Wook Kwack, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 17 days.

(21) Appl. No.: 11/584,642

(22) Filed: Oct. 23, 2006

(65) Prior Publication Data

US 2007/0121401 A1    May 31, 2007

(30) Foreign Application Priority Data

Nov. 29, 2005    (KR) .................. 10-2005-0115081

(51) Int. Cl.
*G11C 7/00* (2006.01)
(52) U.S. Cl. .................... 365/203; 365/233; 365/190
(58) Field of Classification Search ................. 365/203, 365/230.06, 233, 190, 194
See application file for complete search history.

(56) References Cited

U.S. PATENT DOCUMENTS

| 5,638,317 | A | 6/1997 | Tran |
| 6,026,035 | A | 2/2000 | Kim |
| 6,141,275 | A | 10/2000 | Tsai et al. |
| 6,205,069 | B1 | 3/2001 | Kim |
| 6,643,201 | B2 | 11/2003 | Lee et al. |
| 6,771,550 | B2 * | 8/2004 | Park .................... 365/203 |
| 7,304,910 | B1 * | 12/2007 | Hanzawa et al. ........... 365/190 |
| 2006/0002206 | A1 | 1/2006 | Raad et al. |
| 2007/0147160 | A1 * | 6/2007 | Hanzawa et al. ....... 365/230.03 |
| 2007/0263465 | A1 * | 11/2007 | Lee .................... 365/203 |

FOREIGN PATENT DOCUMENTS

| EP | 0 920 025 A1 | 6/1999 |
| JP | 11-086557 | 3/1999 |
| JP | 11-273349 | 10/1999 |
| JP | 2004-234704 | 8/2004 |
| KR | 1020010004550 A | 1/2001 |
| KR | 1020020005874 | 1/2002 |
| KR | 1020030026010 A | 3/2003 |

* cited by examiner

*Primary Examiner*—Gene N. Auduong
(74) *Attorney, Agent, or Firm*—Venable LLP; Jeffri A. Kaminski

(57) ABSTRACT

A precharge circuit prevents voltage dropping of a local input/output line in a semiconductor memory apparatus. The precharge circuit includes at least one pair of pull-up and pull-down precharge circuits. When a local input/output line precharge signal is enabled, a precharge voltage to be applied to each of the precharge circuits is supplied to a local input/output line and a local input/output line-bar. The pull-up precharge circuit has P-type MOS transistors, and the pull-down precharge circuit has N-type transistors. With this configuration, dropping of precharge voltage levels of local input/output lines can be prevented, thus improving reliability of the memory apparatus.

30 Claims, 6 Drawing Sheets

US 7,430,147 B2

PRECHARGE APPARATUS

BACKGROUND

1. Technical Field

The present invention relates to a semiconductor memory apparatus, and more particularly, to a precharge apparatus which can stably maintain a voltage of a local input/output line in a semiconductor memory apparatus.

2. Related Art

Increased frequencies used in semiconductor memory apparatuses result in a concurrent operation speed is increased accordingly. Here, a time required for precharging a local input/output line is a determinant of the operation speed of the semiconductor memory apparatuses. For example, as a read command is applied in a read operation, and a column selection signal becomes active, cell data amplified by a bit line sense amplifier is transmitted to the local input/output line. Subsequently, as the column selection signal becomes inactive, the local input/output line is precharged. Accordingly, when the read commands are successively inputted, the local input/output line needs to perform a develop operation and a precharge operation by turns. In this case, a precharge level of the local input/output line has a great effect on speed and frequency characteristics.

That is, if previous data is not rapidly precharged during data reading, reliability for data to be read next cannot be ensured. This problem becomes more significant during a gapless operation.

FIG. 1 is a schematic view of a semiconductor memory apparatus to which the present invention is applied.

A typical semiconductor memory apparatus 100 includes a memory cell array 110 which has a plurality of memory cells arranged in a matrix shape, a bit line sense amplifier 120 which senses and amplifies a difference between voltages applied to a bit line BL and a bit line-bar BLb of the memory cell array 110, a column selection circuit 130 which selects a specific column of memory cells in response to an address selection signal input from the outside, an input/output sense amplifier 140 which senses and amplifies a voltage difference between data transmitted to a local input/output line LIO and a local input/output line-bar LIOb through the column selection circuit 130, a multiplexer (MUX) 150 which selects data sensed and amplified by the input/output sense amplifier 140 and then transmitted through global input/output lines GIO and GIOb, and an output buffer 160 which outputs data selected by the multiplexer 150. A precharge apparatus 170 is connected to the local input/output line LIO and the local input/output line-bar LIOb. During a precharge operation, the local input/output lines LIO and LIOb are precharged to prescribed levels by the precharge apparatus 170.

FIGS. 2 and 3 are diagrams showing an example of a typical precharge apparatus.

FIG. 2 shows a case where the precharge apparatus 170 has P-type MOS transistors. The precharge apparatus 170 includes a first P-type MOS transistor P1 which is connected between the local input/output line LIO and a bit line precharge voltage input terminal VBLP, a second P-type MOS transistor P2 which is connected between the bit line precharge voltage input terminal VBLP and the local input/output line-bar LIOb, and a third P-type MOS transistor P3 which is connected between the local input/output line LIO and the local input/output line-bar LIOb. Each of the first to third P-type MOS transistors P1, P2, and P3 is driven by a local input/output line precharge-bar signal LIO-PCGb.

FIG. 3 shows a case where the precharge apparatus 170 has N-type MOS transistors. The precharge apparatus 170 includes a first N-type MOS transistor N1 which is connected between the local input/output line LIO and the bit line precharge voltage input terminal VBLP, a second N-type MOS transistor N2 which is connected between the bit line precharge voltage input terminal VBLP and the local input/output line-bar LIOb, and a third N-type MOS transistor N3 which is connected between the local input/output line LIO and the local input/output line-bar LIOb. Each of the first to third N-type MOS transistors N1, N2, and N3 is driven by a local input/output line precharge signal LIO-PCG.

In the precharge apparatuses shown in FIGS. 2 and 3, during the gapless operation, the precharge levels of the local input/output lines LIO and LIOb are dropped due to load capacitance generated at the gate terminals of the MOS transistors. In particular, in the precharge apparatus shown in FIG. 2, since the P-type MOS transistor has lower driving capability than the N-type MOS transistor, worse characteristics appear, regardless of the same gate size. Furthermore, if the channel width of the transistor is increased in order to improve the driving capability of the P-type MOS transistor, gate capacitance may be increased and the layout may be made large.

FIG. 4 is a diagram illustrating a voltage dropping phenomenon of a local input/output device in a semiconductor memory apparatus to which a typical precharge apparatus is applied.

As shown in FIG. 4, the local input/output line precharge signal LIO_PCG or the local input/output line precharge-bar signal LIO_PCGb is enabled to a low or high level during the active operation. Then, potentials of the local input/output line LIO and the local input/output line-bar LIOb are developed by the input/output sense amplifier 140, such that data is sensed. Furthermore, the local input/output line precharge signal LIO_PCG or the local input/output line precharge-bar signal LIO_PCGb is enabled to a high or low level during a local input/output line precharge operation, and then the local input/output lines LIO and LIOb are precharged to the bit line precharge voltage VBLP.

When the active operation and the precharge operation are repeated in the gapless operation, the voltage levels of the local input/output lines LIO and LIOb instantaneously rise or fall due to the coupling phenomenon generated in the MOS transistors constituting the precharge apparatus each time the input/output precharge signal is changed. The coupling noise has an effect on the bit line precharge voltage terminal VBLP. Accordingly, as the operations are repeated, the precharge levels of the local input/output line LIO and the local input/output line-bar LIOb may gradually drop. As a result of the repeated precharge operations, the voltages of the local input/output line LIO and the local input/output line-bar LIOb may drop lower than the bit line precharge voltage VBLP.

As such, if the precharge voltages of the local input/output line LIO and the local input/output line-bar LIOb drop, the input/output sense amplifier senses incorrect data. This problem becomes more significant in high-frequency products or memory apparatuses using a low power supply voltage.

SUMMARY

The present invention addresses the above-described problems, and an advantage of some aspects of the present invention is that it provides a precharge apparatus which can stably maintain a precharge level by simultaneously driving at least two precharge circuits during precharging of a local input/output line and a local input/output line-bar, respectively.

According to an aspect of the present invention, a precharge apparatus includes at least one pair of pull-up and pull-down precharge circuits. When a local input/output line precharge signal is enabled, a voltage to be applied to respective ones of the precharge circuits is supplied to a local input/output line and a local input/output line-bar, respectively.

In a particular configuration, the pull-up precharge circuit has a P-type MOS transistor, and the pull-down precharge circuit has an N-type MOS transistor.

According to another aspect of the present invention, a precharge apparatus includes a precharge section which supplies a bit line precharge voltage to be applied to each of the precharge circuits to a local input/output line and a local input/output line-bar. The precharge section includes at least one pair of precharge circuits which are simultaneously driven by a synchronizing local input/output line precharge signal and a synchronizing local input/output line precharge-bar signal having opposing phases generated when a local input/output line precharge signal is enabled.

In a particular configuration, the precharge section includes a first precharge circuit which is driven by the synchronizing local input/output line precharge signal and supplies the bit line precharge voltage to the local input/output line and the local input/output line-bar; and a second precharge circuit which is driven by the synchronizing local input/output line precharge-bar signal and supplies the bit line precharge voltage to the local input/output line and the local input/output line-bar.

DESCRIPTION OF EXEMPLARY EMBODIMENT

An exemplary embodiment of the present invention will be specifically described with reference to the accompanying drawings.

Figure 1:
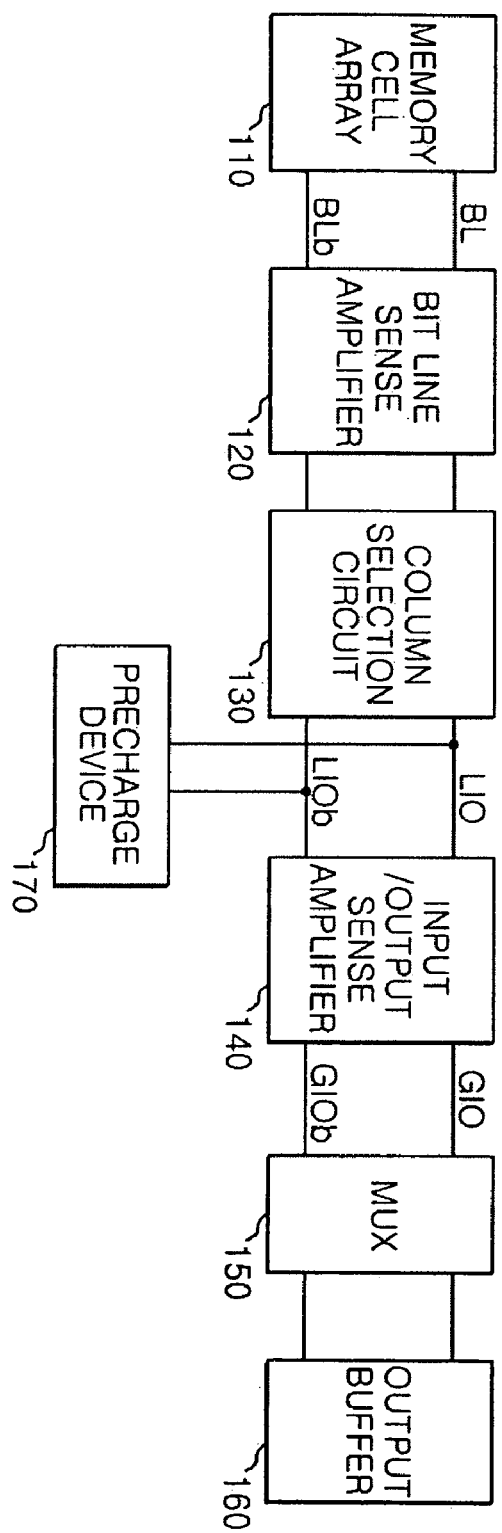
FIG. 1 (prior art) is a schematic view of a semiconductor memory apparatus to which the present invention is applied.
Figure 2:
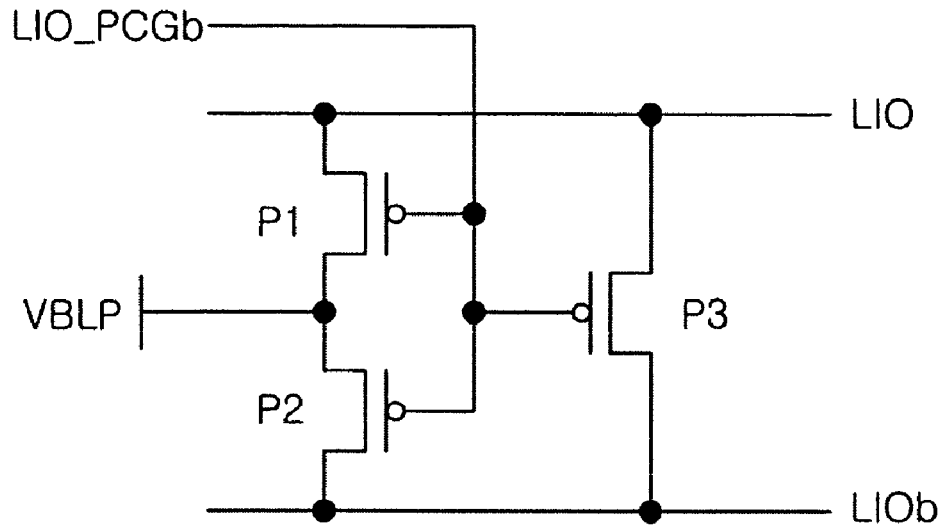
FIG. 2 (prior art) is a diagram showing an example of a typical precharge apparatus.
Figure 3:
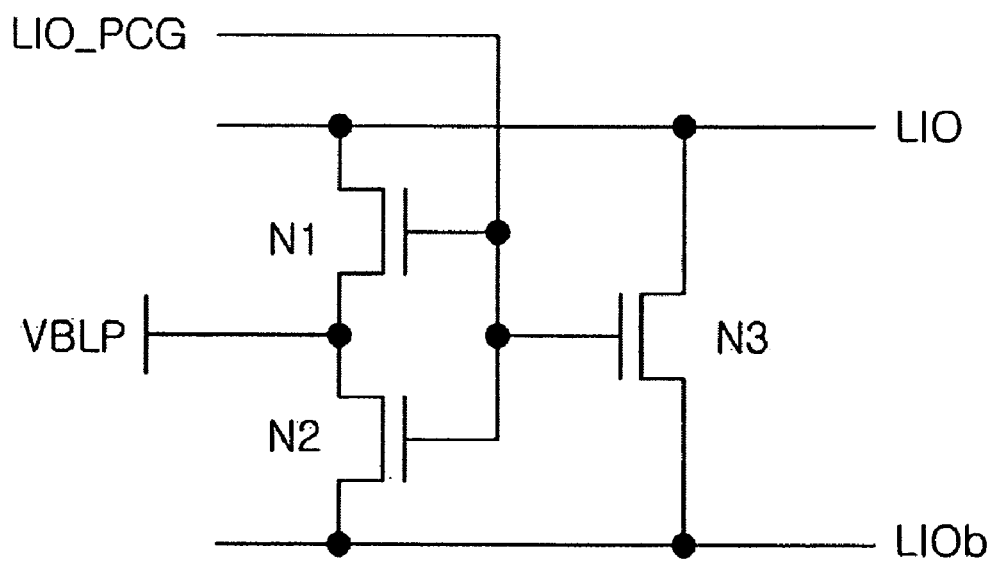
FIG. 3 (prior art) is a diagram showing an example of a typical precharge apparatus.
Figure 4:
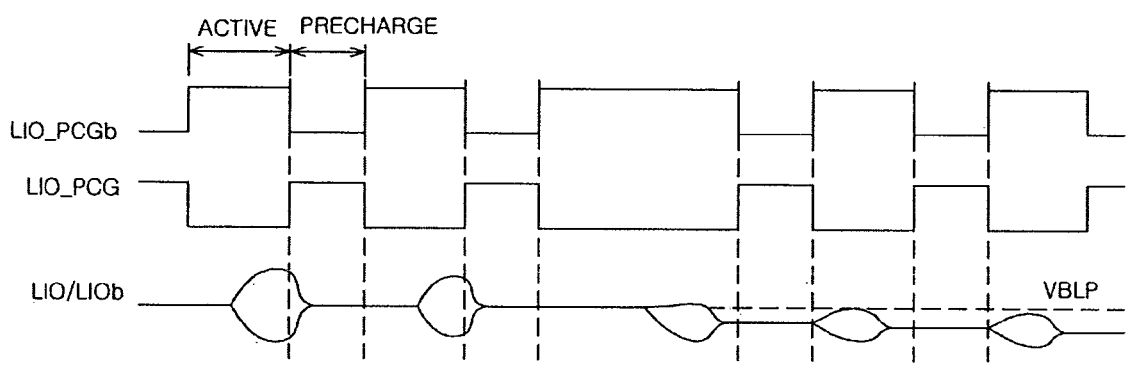
FIG. 4 (prior art) is a diagram illustrating a voltage dropping phenomenon of a local input/output device in a semiconductor memory apparatus to which a typical precharge apparatus is applied.
Figure 5:
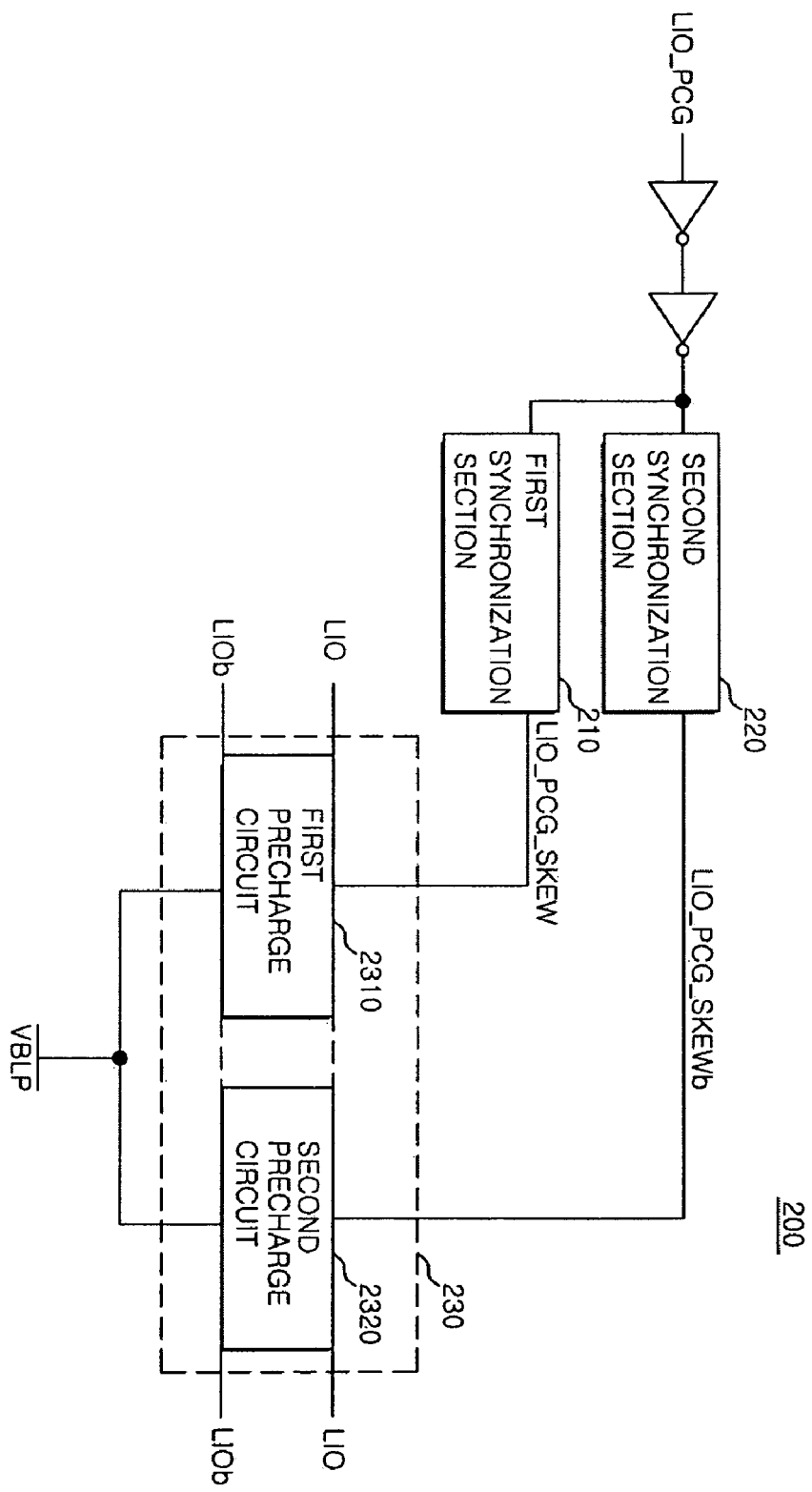
FIG. 5 is a block diagram of a precharge apparatus according to an embodiment of the present invention.

FIG. 5 is a block diagram of a precharge apparatus according to an embodiment of the present invention.

As shown in FIG. 5, a precharge apparatus 200 according to an embodiment of the present invention includes a first synchronization section 210 which receives a local input/output line precharge signal LIO_PCG and outputs a synchronizing local input/output line precharge signal LIO_PCG_SKEW, a second synchronization section 220 which receives the local input/output line precharge signal LIO_PCG and outputs a synchronizing local input/output line precharge-bar signal LIO_PCG_SKEWb having an opposite phase to the output signal LIO_PCG_SKEW of the first synchronization section 210, and a precharge section 230 which supplies a bit line precharge voltage VBLP to local input/output lines LIO and LIOb in response to the output signals of the first and second synchronization sections 210 and 220.

Here, the precharge section 230 can have at least one pair of pull-up and pull-down precharge circuits. In the embodiment of the present invention, the precharge section 230 includes a first precharge circuit 2310 which is driven by the synchronizing local input/output line precharge signal LIO_PCG_SKEW and supplies the bit line precharge voltage VBLP to the local input/output lines LIO and LIOb, and a second precharge circuit 2320 which is driven by the synchronizing local input/output line precharge-bar signal LIO_PCG_SKEWb and supplies the bit line precharge voltage VBLP to the local input/output lines LIO and LIOb.

The precharge apparatus 200 is turned off during an active operation. During a precharge operation, the precharge apparatus 200 prevents dropping of voltage levels of the local input/output lines LIO and LIOb by supplying the bit line precharge voltage VBLP to the local input/output lines LIO and LIOb through the first and second precharge circuits 2310 and 2320 in semiconductor memory apparatuses which perform successive operations or semiconductor memory apparatuses which use a low power supply voltage.

Figure 6:
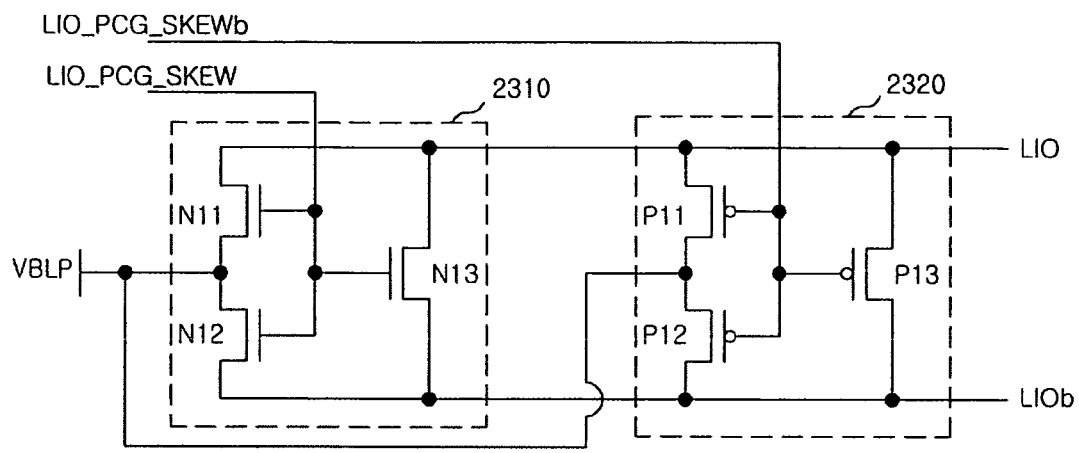
FIG. 6 is a detailed circuit diagram of a precharge section shown in FIG. 5.

FIG. 6 is a detailed circuit diagram of the precharge apparatus shown in FIG. 5.

As shown in FIG. 6, the first precharge circuit 2310 has a first MOS transistor N11 which is connected between the local input/output line LIO and a bit line precharge voltage input terminal VBLP, a second MOS transistor N12 which is connected between the bit line precharge voltage input terminal VBLP and the local input/output line-bar LIOb, and a third MOS transistor N13 which is connected between the local input/output line LIO and the local input/output line-bar LIOb. Each of the first to third MOS transistors N11, N12, and N13 is driven by the synchronizing local input/output line precharge signal LIO_PCG_SKEW. Furthermore, the first to third MOS transistors N11, N12, and N13 are preferably implemented by pull-down MOS transistors such as N-type MOS transistors.

The second precharge circuit 2320 has a fourth MOS transistor P1 which is connected between the local input/output line LIO and the bit line precharge voltage input terminal VBLP, a fifth MOS transistor P12 which is connected between the bit line precharge voltage input terminal VBLP and the local input/output line-bar LIOb, and a sixth MOS transistor P13 which is connected between the local input/output line LIO and the local input/output line-bar LIOb. Each of the fourth to sixth MOS transistors P11, P12, and P13 is driven by the synchronizing local input/output line precharge-bar signal LIO_PCG_SKEWb. Furthermore, the fourth to sixth MOS transistors P11, P12, and P13 are preferably implemented by pull-up MOS transistors such as P-type MOS transistors.

During the precharge operation, in the precharge apparatus 200 according to the embodiment of the present invention, the first and second precharge circuits 2310 and 2320 are simultaneously driven by the synchronizing local input/output line precharge signal LIO_PCG_SKEW and the synchronizing local input/output line precharge-bar signal LIO_PCG_SKEWb having opposing phases from the first and second synchronization sections 210 and 220, respectively.

That is, when the synchronizing local input/output line precharge signal LIO_PCG_SKEW becomes a high level, the first to third MOS transistors N11, N12, and N13 are turned on. Furthermore, the fourth and sixth MOS transistors P11, P12, and P13 are turned on by the synchronizing local input/output line precharge-bar signal LIO_PCG_SKEWb. Accordingly, the potentials of the local input/output lines LIO and LIOb are changed to the level of the precharge voltage VBLP. In particular, during the successive operation in which the precharge signal LIO_PCG is repeatedly changed from the low level to the high level, the voltages to be applied to the local input/output lines LIO and LIOb may instantaneously rise or fall at a time at which the precharge signal LIO_PCG is changed. In a case where the voltage instantaneously rises when the precharge signal LIO_PCG becomes a high level, the voltage can be dropped by the first precharge circuit 2310 having the pull-down MOS transistors. Furthermore, when the voltage falls, voltage dropping can be controlled by the second precharge circuit 2320 having the pull-up MOS transistors.

That is, when the voltages of the local input/output lines LIO and LIOb instantaneously rise by the coupling phenomenon generated due to the repetitive changes of the synchronizing local input/output line precharge signal LIO_PCG_SKEW and the synchronizing local input/output line precharge-bar signal LIO_PCG_SKEWb, the voltages are dropped by the first precharge circuit 2310. Furthermore, when the voltages of the local input/output lines LIO and LIOb instantaneously fall, the voltage rise by the second precharge circuit 2310. Therefore, it is possible to stably maintain the precharge levels of the local input/output lines LIO and LIOb.

Figure 7A:
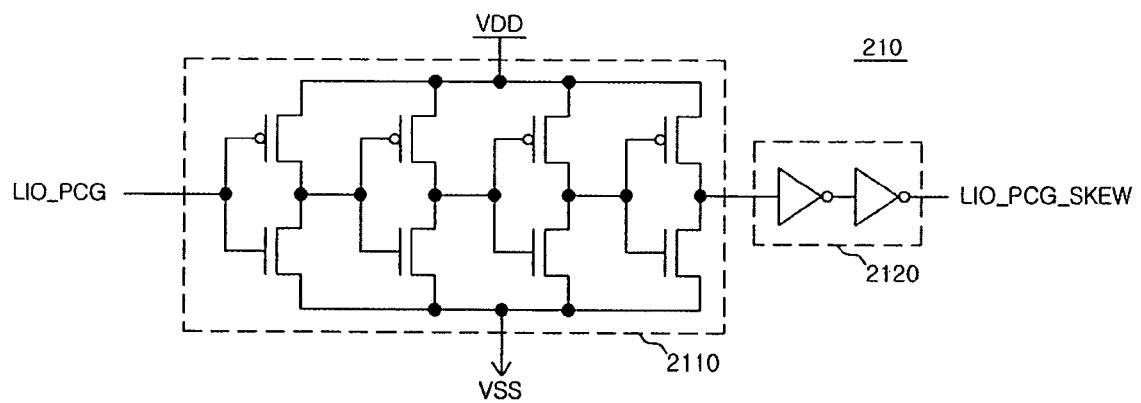
FIG. 7A is a detailed circuit diagram of a first synchronization section shown in FIG. 5.
Figure 7B:
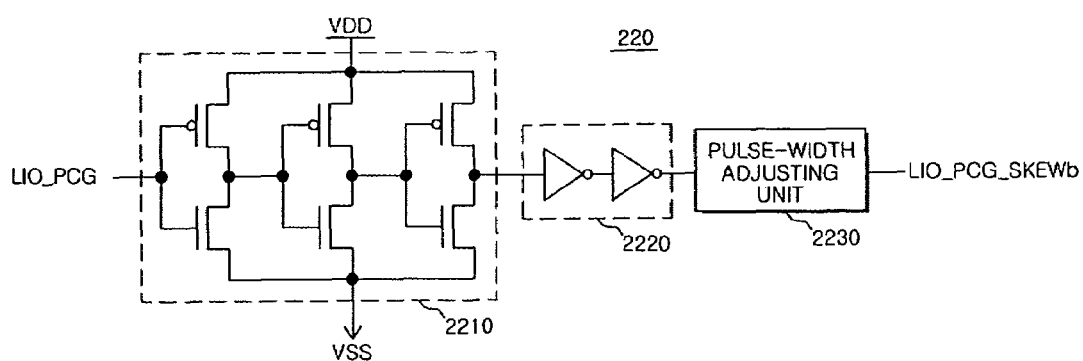
FIG. 7B is a detailed circuit diagram of a second synchronization section shown in FIG. 5.

FIGS. 7A and 7B are detailed circuit diagrams of the first and second synchronization sections shown in FIG. 5, respectively.

FIG. 7A shows an example of the first synchronization section 210. The first synchronization section 210 includes an inverter group 2110 which has inverters connected between a power supply terminal VDD and a ground terminal VSS in parallel, the local input/output line precharge signal LIO_PCG being applied to an input terminal thereof, and a skew correction section 2120 which corrects the skew of an output signal of the inverter group 2110 and outputs the synchronizing local input/output line precharge signal LIO_PCG_SKEW.

Here, the inverter group 2110 can be implemented by an even number of CMOS inverters, and the skew correction section 2120 can be implemented by an even number of inversion elements. A pulse width of the output signal can be controlled by adjusting the channel lengths of MOS transistors constituting each of the CMOS inverters. A skew component of the signal generated when passing through the inverter group 2110 is corrected by the skew correction section 2120.

FIG. 7B shows an example of the second synchronization section 220. The second synchronization section 220 includes an inverter group 2210 which has inverters connected between the power supply terminal VDD and the ground terminal VSS in parallel, the local input/output line precharge signal LIO_PCG being applied to an input terminal thereof, and a skew correction section 2220 which corrects the skew of an output signal of the inverter group 2210. Furthermore, the second synchronization section 220 may further include a pulse-width adjusting unit 2230 which causes the pulse widths of the signal output from the skew correction section 2220 and the signal LIO_PCG_SKEW output from the first synchronization section 210 to match each other and outputs the synchronizing local input/output line precharge-bar signal LIO_PCG_SKEWb.

Here, the inverter group 2210 can be implemented by an odd number of CMOS inverters, and the skew correction section 2220 can be implemented by an even number of inversion elements. A pulse width of the output signal can be controlled by adjusting the channel lengths of MOS transistors constituting each of the CMOS inverters. A skew component of the signal generated when passing through the inverter group 2210 is corrected by the skew correction section 2220.

When the number of the CMOS inverters constituting the inverter group 2210 of the second synchronization section 220 is set to be less than the number of the CMOS inverters constituting the inverter group 2110 of the first synchronization section 210, the output signal of the skew correction section 2220 of the second synchronization section 220 is controlled by the pulse-width adjusting unit 2230, such that the pulse widths of the synchronizing local input/output line precharge signal LIO_PCG_SKEW and the synchronizing local input/output line precharge-bar signal LIO_PCG_SKEWb match each other. If the number of the CMOS inverters constituting the inverter group 2210 of the second synchronization section 220 is set to be more than the number of the CMOS inverters constituting the inverter group 2110 of the first synchronization section 210, a pulse-width adjusting unit may be further provided at the output terminal of the skew correction section 2120 of the first synchronization section 210, such that the pulse widths of the synchronizing local input/output line precharge signal LIO_PCG_SKEW and the synchronizing local input/output line precharge-bar signal LIO_PCG_SKEWb match each other.

Figure 8:
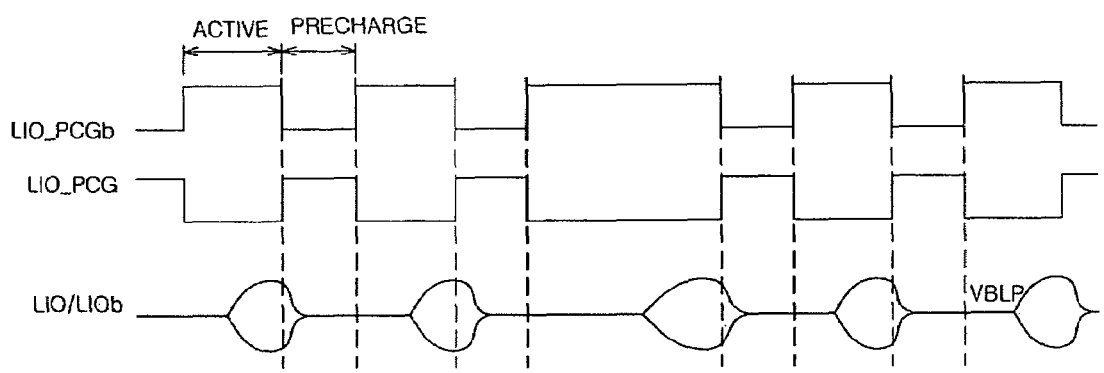
FIG. 8 is a diagram illustrating voltage characteristics of a local input/output device in a semiconductor memory apparatus to which a precharge apparatus according to an embodiment of the present invention is applied.

FIG. 8 is a diagram illustrating a local input/output device in a semiconductor memory apparatus to which the precharge apparatus according to the embodiment of the present invention is applied.

As shown in FIG. 8, the local input/output line precharge signal LIO_PCG and the local input/output line precharge-bar signal LIO_PCGb are enabled to a low or high level during the active operation. Then, the potentials of the local input/output line LIO and the local input/output line-bar LIOb are developed, and an input/output sense amplifier senses data. Furthermore, the local input/output line precharge signal LIO_PCG or the local input/output line precharge-bar signal LIO_PCGb are enabled to a high or low level during the local input/output line precharge operation, the local input/output lines LIO and LIOb are precharged to the bit line precharge voltage VBLP.

During a gapless operation, when the active operation and the precharge operation are repeated, the voltage levels of the local input/output lines LIO and LIOb may instantaneously rise or fall due to the coupling phenomenon in the MOS transistors constituting the precharge apparatus each time the input/output precharge signal is changed. In contrast, in the precharge apparatus according to the embodiment of the present invention, with the first precharge circuit 2310 having the pull-down MOS transistors and the second precharge circuit 2320 having the pull-up MOS transistors, the rising voltages are dropped to the level of the precharge voltage VBLP, and the falling voltages rise to the level of the precharge voltage VBLP. Therefore, the local input/output lines LIO and LIOb can constantly maintain the precharge voltage VBLP.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

According to the embodiment of the present invention, dropping of the precharge voltage levels of the local input/output lines can be prevented, and thus operation reliability of the memory apparatus can be improved. In particular, the precharge apparatus according to the embodiment of the present invention can effectively prevent an erroneous operation of the memory apparatus upon the application to a high-speed memory apparatus or a memory apparatus using a low power supply voltage.

What is claimed is:

1. A precharge apparatus, comprising:
   at least one pair of pull-up and pull-down precharge circuits,
   wherein, when a local input/output line precharge signal is enabled, the pull-down precharge circuit and the pull-up precharge circuit are respectively driven in response to a synchronizing local input/output line precharge signal and a synchronizing local input/output line precharge-bar signal generated from the local input/output line precharge signal by skew-adjusting, and a precharge voltage to be applied to each of the precharge circuits is supplied to a local input/output line and a local input/output line-bar.

2. The precharge apparatus of claim 1, wherein the pull-up precharge circuit includes P-type MOS transistors, and the pull-down precharge circuit includes N-type MOS transistors.

3. The precharge apparatus of claim 1, further comprising:
   a first synchronization section which receives the local input/output line precharge signal and outputs the synchronizing local input/output line precharge signal so as to drive one of the pair of precharge circuits; and
   a second synchronization section which receives the local input/output line precharge signal and outputs the synchronizing local input/output line precharge-bar signal having an opposite phase to the synchronizing local input/output line precharge signal so as to drive the other precharge circuit.

4. The precharge apparatus of claim 3, wherein
   the pair of precharge circuits includes a precharge circuit having pull-down MOS transistors and a precharge circuit having pull-up MOS transistors, and
   the synchronizing local input/output line precharge signal output from the first synchronization section is a driving signal of the precharge circuit having the pull-down MOS transistors.

5. The precharge apparatus of claim 3, wherein:
   the pair of precharge circuits includes a precharge circuit having pull-down MOS transistors and a precharge circuit having pull-up MOS transistors, and
   the synchronizing local input/output line precharge-bar signal output from the second synchronization section is a driving signal of the precharge circuit having pull-up MOS transistors.

6. The precharge apparatus of claim 3, wherein
   the first synchronization section includes:
   an inverter group which receives the local input/output line precharge signal, and
   a skew correction section which receives an output signal of the inverter group and outputs the synchronizing local input/output line precharge signal.

7. The precharge apparatus of claim 3, wherein the second synchronization section includes:
   an inverter group which receives the local input/output line precharge signal, and
   a skew correction section which receives an output signal of the inverter group and outputs the synchronizing local input/output line precharge-bar signal.

8. The precharge apparatus of claim 6, wherein the inverter group includes an even number of CMOS inverters connected in series.

9. The precharge apparatus of claim 6, wherein the skew correction section includes an even number of inversion elements connected in series.

10. The precharge apparatus of claim 7, wherein the inverter group includes an odd number of CMOS inverters connected in series.

11. The precharge apparatus of claim 7, wherein the skew correction section includes an even number of inversion elements connected in series.

12. The precharge apparatus of claim 7, wherein the second synchronization section further includes a pulse-width adjusting unit which is connected to an output terminal of the skew correction section so as to control a pulse width of a signal output from the skew correction section.

13. A precharge apparatus, comprising:
    a precharge section which has at least one pair of precharge circuits to be simultaneously driven by a synchronizing local input/output line precharge signal and a synchronizing local input/output line precharge-bar signal, generated from a local input/output line precharge signal by skew-adjusting, having opposing phases generated when the local input/output line precharge signal is enabled, and supplies a bit line precharge voltage to be applied to each of the precharge circuits to a local input/output line and a local input/output line-bar.

14. The precharge apparatus of claim 13, wherein the precharge section includes:
    a first precharge circuit which is driven by the synchronizing local input/output line precharge signal and supplies the bit line precharge voltage to the local input/output line and the local input/output line-bar, and
    a second precharge circuit which is driven by the synchronizing local input/output line precharge-bar signal and supplies the bit line precharge voltage to the local input/output line and the local input/output line-bar.

15. The precharge apparatus of claim 14, wherein the first precharge circuit includes:
    a first MOS transistor which is connected between the local input/output line and a bit line precharge voltage input terminal,
    a second MOS transistor which is connected between the bit line precharge voltage input terminal and the local input/output line-bar, and
    a third MOS transistor which is connected between the local input/output line and the local input/output line-bar,
    each of the first to third MOS transistors is driven by the synchronizing local input/output line precharge signal.

16. The precharge apparatus of claim 15, wherein the first to third MOS transistors are pull-down MOS transistors.

17. The precharge apparatus of claim 14, wherein the second precharge circuit includes:
    a first MOS transistor which is connected between the local input/output line and the bit line precharge voltage input terminal,
    a second MOS transistor which is connected between the bit line precharge voltage input terminal and the local input/output line-bar, and a third MOS transistor which is connected between the local input/output line and the local input/output line-bar, each of the first to third MOS transistors is driven by the synchronizing local input/output line precharge-bar signal.

18. The precharge apparatus of claim 17, wherein the first to third MOS transistors are pull-up MOS transistors.

19. The precharge apparatus of claim 13, further comprising:

a first synchronization section which receives the local input/output line precharge signal and outputs the synchronizing local input/output line precharge signal; and a second synchronization section which receives the local input/output line precharge signal and outputs the synchronizing local input/output line precharge-bar signal having an opposite phase to the output signal of the first synchronization section.

20. The precharge apparatus of claim 19, wherein the first synchronization section includes:

an inverter group which receives the local input/output line precharge signal, and a skew correction section which receives an output signal of the inverter group and outputs the synchronizing local input/output line precharge signal.

21. The precharge apparatus of claim 20, wherein the inverter group includes an even number of CMOS inverters connected in series.

22. The precharge apparatus of claim 20, wherein the skew correction section includes an even number of inversion elements connected in series.

23. The precharge apparatus of claim 19, wherein the second synchronization section includes:

an inverter group which receives the local input/output line precharge signal, and a skew correction section which receives an output signal of the inverter group and outputs the synchronizing local input/output line precharge-bar signal.

24. The precharge apparatus of claim 23, wherein the inverter group includes an odd number of CMOS inverters connected in series.

25. The precharge apparatus of claim 23, wherein the skew correction section includes an even number of inversion elements connected in series.

26. The precharge apparatus of claim 23, wherein the second synchronization section further includes a pulse-width adjusting unit which is connected to an output terminal of the skew correction section so as to control a pulse width of a signal output from the skew correction section.

27. A precharge apparatus, comprising:

at least one pair of pull-up and pull-down precharge circuits, and at least one pair of a synchronizing local input/output line precharge signal and a synchronizing local input/output line precharge-bar signal generated from a local input/output line precharge signal by skew-adjusting, wherein, when the local input/output line precharge signal is enabled, the pull-down and the pull-up precharge circuits are respectively driven in response to the synchronizing local input/output line precharge signal and the synchronizing local input/output line precharge-bar signal.

28. The precharge apparatus of claim 27 further comprises:

a first synchronization section which receives the local input/output line precharge signal and outputs the synchronization local input/output precharge signal so as to drive a first of the pair of precharge circuits; and a second synchronization section which receives the local input/output line precharge signal and outputs the synchronization local input/output line precharge-bar signal having an opposite phase to the synchronization local input/output line precharge signal, so as to drive a second of the pair of precharge circuits.

29. The precharge apparatus of claim 28, wherein
the first synchronization section includes:
an inverter group which receives the local input/output line precharge signal, and
a skew correction section which receives an output signal of the inverter group and outputs the synchronizing local input/output line precharge signal.

30. The precharge apparatus of claim 28, wherein the second synchronization section includes:
an inverter group which receives the local input/output line precharge signal, and
a skew correction section which receives an output signal of the inverter group and outputs the synchronizing local input/output line precharge-bar signal.

* * * * *